United States Patent
Kuo et al.

(10) Patent No.: US 7,038,225 B2
(45) Date of Patent: *May 2, 2006

(54) METHOD AND APPARATUS FOR ELECTRON BEAM PROCESSING OF SUBSTRATES

(75) Inventors: David Shiao-Min Kuo, Palo Alto, CA (US); Christopher Joseph Formato, Brentwood, CA (US); Neil Deeman, Alamo, CA (US); Sundeep Chauhan, Edina, MN (US); Lawrence Matthias Bryant, Palo Alto, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/875,629

(22) Filed: Jun. 23, 2004

(65) Prior Publication Data
US 2005/0285053 A1    Dec. 29, 2005

(51) Int. Cl.
*H01J 37/00* (2006.01)
*G11B 5/596* (2006.01)

(52) U.S. Cl. .............. 250/492.22; 250/491.1; 250/492.1; 250/492.2; 250/492.3; 250/396 R; 250/397; 250/398

(58) Field of Classification Search .......... 250/491.1, 250/492.1–492.3, 492.22, 398, 396 R, 397
See application file for complete search history.

(56) References Cited

U.S. PATENT DOCUMENTS

| | | | | |
|---|---|---|---|---|
| 3,956,635 A | * | 5/1976 | Chang | 250/492.2 |
| 4,820,928 A | * | 4/1989 | Ooyama et al. | 250/492.2 |
| 5,136,169 A | * | 8/1992 | Smith et al. | 250/491.1 |
| 5,148,322 A | * | 9/1992 | Aoyama et al. | 359/708 |
| 6,262,429 B1 | * | 7/2001 | Rishton et al. | 250/492.23 |
| 6,393,604 B1 | * | 5/2002 | Yamada et al. | 716/21 |
| 6,500,497 B1 | * | 12/2002 | Wang et al. | 427/528 |
| 2003/0021206 A1 | * | 1/2003 | Tomita | 369/53.23 |

* cited by examiner

*Primary Examiner*—John R. Lee
*Assistant Examiner*—Bernard E. Souw (57) ABSTRACT

Embodiments of the invention generally provide an electron beam substrate processing system. In one embodiment, the present invention provides an electron beam substrate processing system where a spindle shaft used to rotate substrates during processing includes two encoder wheels. One encoder wheel is configured to provide a rotational speed data signal to a rotational speed control system. Another encoder wheel is configured to provide a pattern generator clock signal at a higher frequency than the rotational speed data signal to a pattern generator. In one embodiment of the present invention, at least one of the encoder wheels is positioned adjacent the substrate to minimize torsional and differential movements between the at least one encoder wheel and the substrate.

20 Claims, 5 Drawing Sheets

METHOD AND APPARATUS FOR ELECTRON BEAM PROCESSING OF SUBSTRATES

BACKGROUND OF THE INVENTION

1. Field of the Invention

The invention relates generally to processing substrates with electron beams. More particularly, the present invention relates to applying electron beams to surfaces of semiconductor substrates to write patterns thereon.

2. Description of the Related Art

In electron beam substrate processing systems, a narrowly converged electron beam is applied to target positions on the surface of substrates to form patterns thereon. Electron beam substrate processing systems generally include an electron gun, electromagnetic lens, and a vacuum chamber for holding the specimen substrate. Electron beam substrate processing systems write a desired pattern on a substrate surface usually coated with electron beam resist by focusing, directing, and blanking the electron beam such that only specified surface areas of the substrate are processed.

Processing substrates generally involves raster-scan and vector-scan processes. According to the raster-scan process, a region of the substrate, also referred to as a field, is sequentially and fully scanned at the same speed, one end to the other, before moving to the next field. The electron beam is applied to the region of the field where a pattern is to be written and blocked, from other regions by a blanking mechanism. According to the vector-scanning process, an electron beam skips areas where no graphic pattern is to be written, and is deflected only to a substrate surface area where a pattern is to be written.

Substrates are often processed with electron beam processing systems where the substrate is placed on a chuck within a vacuum-processing chamber. Such electron beam assemblies usually include a load lock chamber and transfer robot to hold and transfer the substrates onto the chuck for processing. To position the substrate within a preferred radius of the electron beam the chuck and substrate thereon are moved in a horizontal X and Y direction. Once in a desired position the electron beam may be deflected to more accurately position the electron beam onto the substrate.

Substrates may be processed using rotating electron beam substrate processing systems. Rotating electron beam substrate processing systems rotate substrates underneath a narrowly focused electron beam that may also use deflection to accurately position the electron beam on the substrate surface. Similar to the non-rotating electron beam systems, blanking control is generally used to selectively apply the electron beam to a surface region of the rotating substrate surface.

In rotating electron beam substrate processing systems, the substrate is mounted on a rotating spindle assembly. The rotating spindle assembly is coupled to a spindle motor that provides rotational speed to the spindle and therefore the specimen substrate. The rotational velocity and acceleration of the spindle is generally controlled by a controller in communication with the spindle motor. The spindle assembly is generally configured to move in a radial direction relative an electron beam discharge assembly, i.e., electron gun, to allow the electron beam to be precisely positioned on desired surfaces of the rotating substrate. As the substrate is rotated and moved, the electron beam is deflected as needed and applied to the desired regions of the substrate using a blanking control. To correctly apply the proper pattern to the substrate being processed, a pattern clock may be used. Conventionally, the pattern clock is associated with the spindle rotational speed and position of the spindle relative the electron beam such that at calculated times based on the angular rotation and movement of the substrate, a pattern region will be positioned within a radius of the electron beam for processing.

Generally, an optical encoder is used in the control the rotation of the spindle. The optical encoder generally includes an optical reader positioned to read an optical encoder disk. Conventionally, to mechanically couple the optical encoder disk to the substrate, the optical encoder disk is mounted on an end of the spindle shaft distal the substrate. As the spindle motor rotates, the optical reader detects timing marks on the optical disk to determine the speed of rotation. To maximize resolution, the timing marks are usually placed on the outer edge of the encoder disk. The detected timing marks generally provide a rotational velocity signal used as a rotation control signal and as a pattern clock signal for a pattern generation circuit. The rotation of the spindle motor is phase locked to the master clock such that the rotation of the spindle motor is adjusted until the master clock and rotation control signal are in phase. The pattern clock signal is used by the pattern generation circuit to control a blanking mechanism of the rotating electron beam substrate processing system to control the on and off time of the electron beam.

Generally, a greater number of timing marks and a closer spacing therebetween, results in a greater frequency of the rotation control signal, i.e., the pattern clock signal, which is preferable to achieve more accurate circumferential positioning of electron beam recording locations and thereby better pattern resolution. However, many encoders have frequency limitations that limit the upper frequency that can be produced. Generally, a compromise is made on the number or timing marks and spindle rotational velocity to accommodate the limitations of the encoder and achieve acceptable and electron beam circumferential position accuracy. Unfortunately, improved pattern resolution control may be sacrificed for rotational speed control at higher spindle speeds.

Due to the positional distance between the optical encoder disk and the substrate, and torsion on the spindle shaft under rapid acceleration changes, the instantaneous rotational velocity of the optical encoder and substrate may differ. Further, the spindle shaft is subject to structural resonances, bending modes, torsional modes, friction, and the like that contribute to pattern placement errors, e.g., track-to-track phase error of written patterns. Thus, due to such torsional stresses, friction, and structural deflections the pattern generation circuit may be given erroneous timing data causing the pattern position of the substrate surface under the electron beam to be misaligned.

Therefore, a need exists for a method and apparatus to minimize misalignment errors between an electron beam and the substrate pattern target while improving substrate processing pattern resolution.

SUMMARY OF THE INVENTION

One embodiment of the present invention is an electron beam substrate processing apparatus. The electron beam substrate processing apparatus includes a substrate processing chamber defined by sidewalls, a bottom, and a top. The electron beam substrate processing apparatus further includes a spindle motor assembly moveably disposed within the substrate processing chamber, a spindle shaft extending from the spindle motor assembly toward the top, and a substrate support member disposed on an end of the spindle shaft distal the spindle motor assembly. The substrate support member having a substrate supporting surface thereon. The electron beam substrate processing apparatus also includes a first encoder wheel disposed on the spindle shaft and positioned adjacent the substrate support member and a first optical detector positioned in optical communication with the first encoder wheel. The first optical detector being configured to output rotation data signals in response to detected rotation of the first encoder wheel. The electron beam substrate processing apparatus further includes a second encoder wheel disposed on the spindle shaft and positioned adjacent the substrate support member and a second optical detector positioned in optical communication with the second encoder wheel. The second optical detector being configured to output pattern data signals in response to detected rotation of the second encoder wheel. An electron beam assembly is disposed to the substrate processing chamber and configured to direct an electron beam onto a surface of the substrate for processing.

An embodiment of the present invention is a method of processing substrates with an electron beam processing system. The method includes rotating a substrate support member configured to hold the substrate thereon for processing, generating rotation data signals from one encoder assembly associated with a rotational movement of the substrate support member and generating pattern clock signals from another encoder assembly associated with the rotational movement of the substrate support member. The method includes processing at least some of the pattern clock signals to generate an electron beam processing pattern for writing a pattern on a surface of the substrate.

An embodiment of the present invention is an apparatus for processing a substrate with electron beams. The apparatus includes rotation means for rotating a substrate support member for processing a substrate thereon, first signal generator means for generating a rotation clock signal from the axial rotation of the substrate, and a second signal generator means for generating a pattern clock signal from the axial rotation of the substrate. The apparatus further includes an electron beam generation means for processing the substrate with electron beams.

BRIEF DESCRIPTION OF THE DRAWINGS

So that the manner in which the above recited embodiments of the invention are attained and can be understood in detail, a more particular description of the invention, briefly summarized above, may be had by reference to the embodiments thereof which are illustrated in the appended drawings. The appended drawings illustrate only typical embodiments of this invention and are therefore not to be considered limiting of its scope, for the invention may admit to other equally effective embodiments.

DETAILED DESCRIPTION OF THE PREFERRED EMBODIMENTS

In the following description, numerous specific details are set forth to provide a more thorough understanding of the present invention. However, it will be apparent to one skilled in the art that the present invention may be practiced without one or more of these specific details. In other instances, well-known features have not been described in order to avoid obscuring the present invention.

As will be described below, embodiments of the present invention pertain to specific method steps implementable on computer systems. In one embodiment, the invention may be implemented as a computer program-product for use with a computer system. The programs defining the functions of at least one embodiment can be provided to a computer via a variety of computer-readable media (i.e., signal-bearing medium), which include but are not limited to, (i) information permanently stored on non-writable storage media (e.g. read-only memory devices within a computer such as read only CD-ROM disks readable by a CD-ROM or DVD drive; (ii) alterable information stored on a writable storage media (e.g. floppy disks within diskette drive or hard-disk drive); or (iii) information conveyed to a computer by communications medium, such as through a computer or telephone network, including wireless communication. The latter specifically includes information conveyed via the Internet. Such signal-bearing media, when carrying computer-readable instructions that direct the functions of the invention, represent alternative embodiments of the invention. It may also be noted that portions of the product program may be developed and implemented independently, but when combined together are embodiments of the invention.

Figure 1:
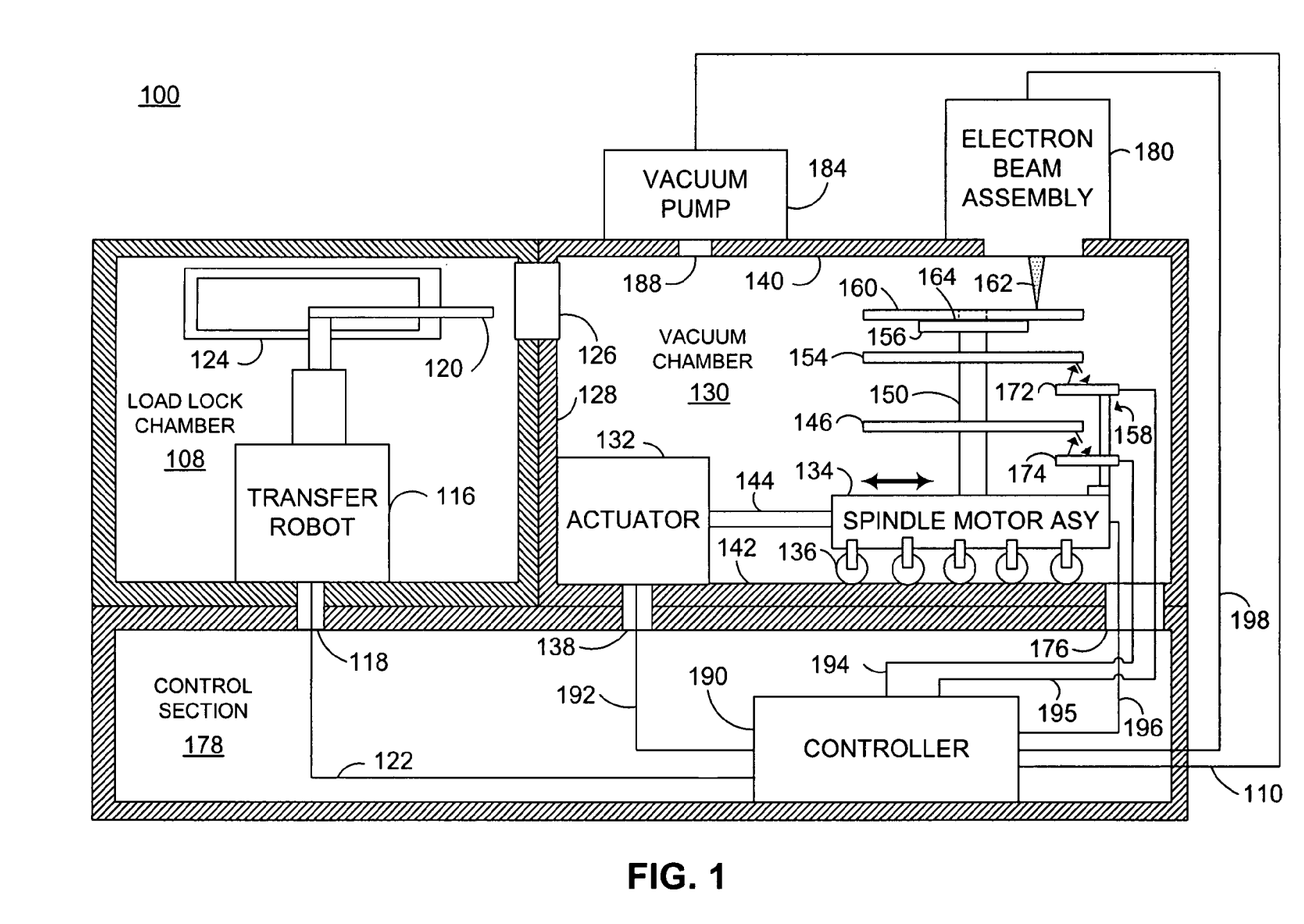
FIG. 1 is a high-level illustration of one embodiment of an electron beam substrate processing system in accordance with embodiments of the invention.

FIG. 1 is a high-level illustration of one embodiment of an electron beam substrate processing system 100 in accordance with embodiments of the invention. Electron beam substrate processing system 100 includes load lock chamber 108 and vacuum chamber 130. Vacuum chamber 130 is defined by sidewalls 128, top 140, and bottom 142. Load lock chamber 108 is in communication with vacuum chamber 130 via valve 126 disposed therebetween. Valve 126 may be configured to provide a vacuum seal between load lock chamber 108 and vacuum chamber 130. Valve 126 may be virtually any valve type, such as a slot valve, configured to allow substrates 160 to pass therethough. Electron beam substrate processing system 100 includes electron beam assembly 180 disposed on vacuum chamber 130 and positioned thereon in processing communication with substrate 160 disposed therein for processing with one or more electron beams 162. In one embodiment, load lock chamber 108 and vacuum chamber 130 are disposed on control section 178 configured to supply control signals, power, etc., to electron beam substrate processing system 100. Vacuum chamber 130, load lock chamber 108, and control section 178 may be formed of rigid metal materials such as aluminum, steel, and the like, configured to accommodate a plurality of substrate processes. To maintain a desired vacuum, vacuum chamber 130 is coupled to vacuum pump 184 through valve 188. Control section 178 includes substrate process controller 190 used to control at least some of the substrate processing operations described herein. Vacuum pump 184 may be controlled by substrate process controller 190 via signal 110.

Load lock chamber 108 includes transfer robot 116 configured to move substrates 160 to and from vacuum chamber 130 through valve 126 for processing using transfer arm 120. Transfer robot 116 may be controlled by substrate process controller 190 via signal 122. To maintain a vacuum seal between load lock chamber 108 and control section 178, signal 122 may be coupled to transfer robot 116 through seal 118. In one embodiment, load lock chamber 108 receives substrates 160 for processing through valve 124.

Electron beam substrate processing system 100 includes spindle motor assembly 134 movably disposed within vacuum chamber 130. In one embodiment of the present invention, spindle motor assembly 134 is disposed on transport assembly 136. Transport assembly 136 may include virtually any type of transport mechanism, such as wheels, rollers, bearings, gears, and the like, configured to allow the about horizontal motion of spindle motor assembly 134 along bottom 142 of vacuum chamber 130. Spindle motor assembly 134 is coupled to actuator 132 via arm 144. Actuator 132 may be one of a variety actuator types such as linear actuators, rotary actuators, and the like. In one embodiment, actuator 132 is a linear actuator configured to move spindle motor assembly 134 with arm 144 in about a linear straight-line motion. In another embodiment, actuator 132 is a rotary actuator configured to move spindle motor assembly 134 using arm 144 in a horizontal angular motion about a rotational center of actuator 132. While spindle motor assembly 134 may be disposed on transport assembly 136 for support thereof, it is contemplated that in one configuration spindle motor assembly 134 does not use transport assembly 136 and therefore may be entirely supported by arm 144 above bottom 142.

Spindle motor assembly 134 includes spindle shaft 150 extending vertically therefrom toward a top 140 of vacuum chamber 130. Spindle shaft 150 is rotatably coupled on one end to spindle motor assembly 134 configured to axially rotate spindle shaft 150 at one or more rotational velocities. A substrate support member 156 is coupled on another end of spindle shaft 150 distal spindle motor assembly 134. Substrate support member 156 may be virtually any type of substrate support such as an electronic chuck, mechanical clamp, and the like, configured to hold substrate 160 thereon for processing. Substrate support member 156 may be configured with support surface 164 configured to support substrate 160 thereon. Substrate support member 156 may be sized with virtually any diameter that may be used to advantage. For example, substrate support member 156 may be sized to about a similar diameter of substrate 160. Substrate support member 156 may be positioned in proximity to top 140 such that a surface portion of substrate 160 may be aligned in proximity of electron beam 162 to form patterns thereon.

To determine rotational movements of the rotatable spindle shaft 150 and associated substrate rotational speed, encoder wheel 146 is positioned on the spindle shaft 150 about parallel to and in proximity of substrate support member 156 to rotate therewith. Encoder wheel 146 may be mounted to spindle shaft 150 using one or more methods as are known in the art. While, encoder wheel 146 may be configured in diameter about that of substrate 160, it is contemplated that the diameter of encoder wheel 146 may be of virtually any diameter that may be used to advantage. In one embodiment, encoder wheel 146 is positioned adjacent substrate support member 156 to minimize the effects of torsion and vibration on spindle shaft 150 during rotation. In one embodiment, encoder wheel 146 may be integral to substrate support member 156.

An optical detector assembly 158 is disposed on and extends from spindle motor assembly 134. Optical detector 174 extends from optical detector assembly 158 in proximity to encoder wheel 146 to detect rotation markings thereon, some of which are described below with reference to FIG. 2. As encoder wheel 146 rotates with spindle shaft 150, such rotation markings are detected, translated as rotation signals by optical detector 174, and transmitted to substrate process controller 190 via rotation data signal 194.

In one embodiment of the present invention, electron beam substrate processing system 100 may include another encoder wheel 154 and another optical detector 172 extending from optical detector assembly 158. Optical detector 172 is positioned to be in optical communication with at least some rotation markings on encoder wheel 154 some of which are described with reference to FIG. 3. Encoder wheel 154 is positioned along rotatable spindle shaft 150 about parallel to and in proximity of substrate support member 156. Encoder wheel 154 may be mounted to rotatable spindle shaft 150 using one or more methods as are known in the art. In one embodiment, encoder wheel 154 may be integral to substrate support member 156. While encoder wheel 154 may be configured in diameter about that of substrate 160, it is contemplated that the diameter of encoder wheel 154 may be of virtually any diameter that may be used to advantage. As encoder wheel 154 rotates with spindle shaft 150, rotation markings on encoder wheel 154 are detected by optical detector 172 and then transmitted as encoder signals to substrate process controller 190 via pattern clock signal 195.

In one embodiment, encoder wheel 146 and encoder wheel 154 may be combined into a single encoder wheel. For example, such a combination of encoder wheel 154 and encoder wheel 146 may be configured with timing marks on both sides. Thus, one side of such combination encoder wheel may be used to generate rotation data signal 194 from one side and generate pattern clock signal 195 from another side.

In another embodiment, rotation data signal 194 and pattern clock signal 195, while separated electrically from one another, are mechanically linked together to maintain an about fixed phase relationship therebetween. For example, as encoder wheel 146 and encoder wheel 154 are mechanically coupled through spindle shaft 150, the phase of rotation data signal 194 and pattern clock signal 195 are mechanically locked together.

For purposes of clarity, encoder wheel 146 and encoder wheel 154 are described herein disposed within vacuum chamber 130. However, vacuum is not required for the operation of encoder wheel 146 or encoder wheel 154. Therefore, it is contemplated in at least one configuration of electron beam substrate processing system 100 that includes a portion of spindle shaft 150 exposed to atmospheric pressure, that encoder wheel 146, encoder wheel 154, or both, may be positioned on spindle shaft 150 such that they may be exposed to atmospheric pressure.

In one operational configuration, substrate process controller 190 may be used to control a rotational speed of rotatable spindle shaft 150 and a position of spindle motor assembly 134 within vacuum chamber 130 to place one or more surface targets of substrate 160 within a desired proximity of electron beam output 162 for processing. Such targets may include a portion of the substrate surface with electron beam resist disposed thereon. Rotation data signal 194 and pattern clock signal 195 may be processed by substrate process controller 190 to determine the time and position pattern to apply electron beam 162 to the substrate surface during processing. For example, substrate process controller 190 in response to rotation data signal 194, provides signal 196 to spindle motor assembly 134 to control the rotation of spindle shaft 150. Substrate process controller 190, in response to pattern clock signal 195, provides control signal 198 configured to control the modulation of electron beam 162. For example, control signal 198 may be used to turn electron beam 162 on and off at desired times during substrate processing to form a desired pattern on a surface of substrate 160. To maintain a vacuum within vacuum chamber 130, signal 196, rotation data signal 194, and pattern clock signal 195 may be coupled to vacuum chamber 130 through seal 176.

Figure 2:
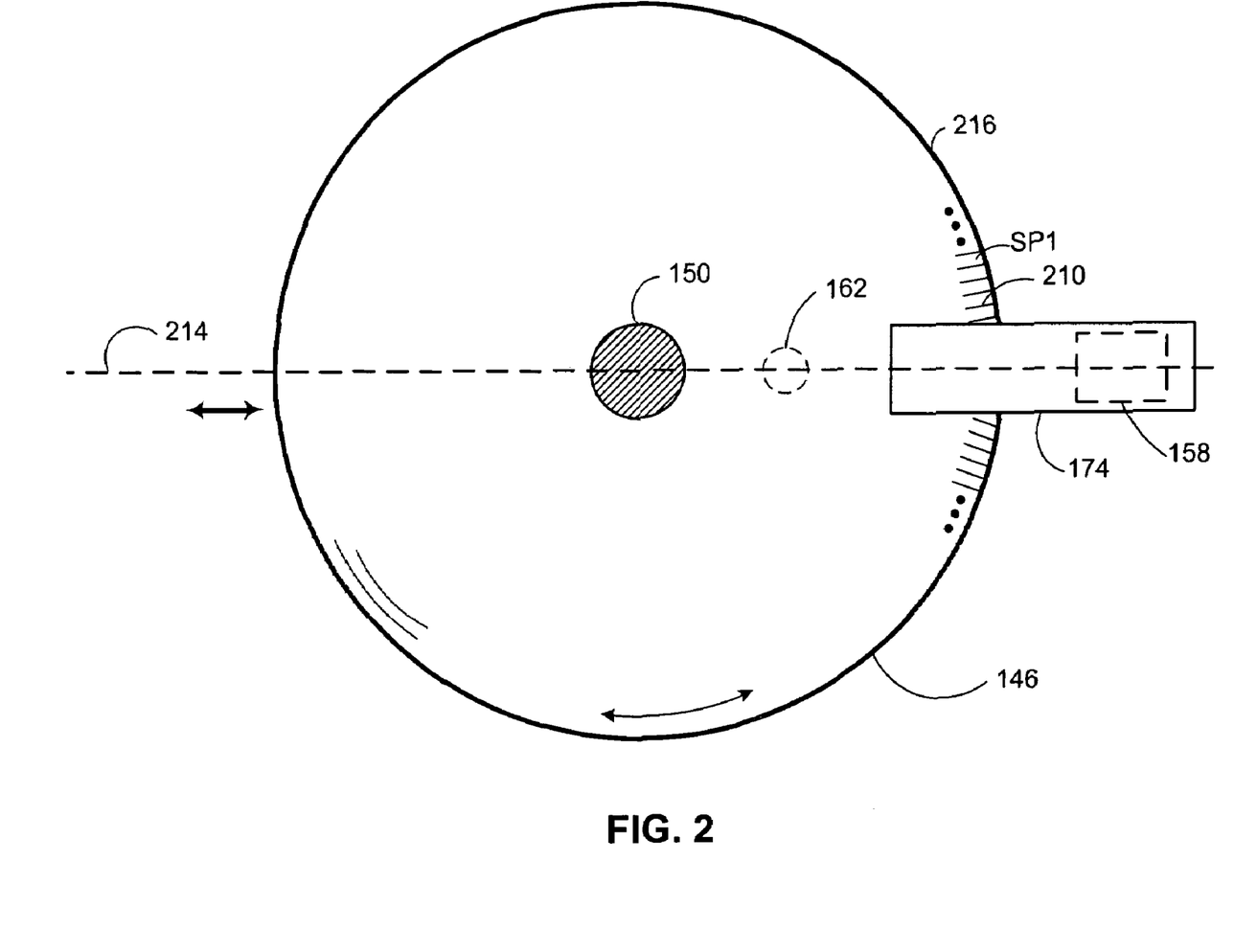
FIG. 2 is a high-level illustration of one embodiment of an encoder wheel of the electron beam substrate processing system of FIG. 1 in accordance with embodiments of the invention.

FIG. 2 is a high-level illustration of one embodiment of an encoder wheel 146 of the electron substrate processing system 100 of FIG. 1 in accordance with embodiments of the invention. Encoder wheel 146 includes a plurality of markings 210 (only some examples of which are illustrated in FIG. 2) generally disposed about an outer circumference of encoder wheel 146. To maximize the number of markings 210, markings 210 may be placed on an outer perimeter 216, e.g., outer edge, of encoder wheel 146 and the diameter of encoder wheel 146 may be increased. Such markings 210 are detected by optical detector 174. For purposes of clarity, markings 210 shall be described in terms of an about equal spacing of SP1, however virtually any spacing configuration may be used to advantage. Spacing SP1 may be configured to accommodate a plurality of rotational speed control systems. For example, spacing SP1 may be configured to provide lower frequency rotation data signals 194 for those systems requiring lower frequency rotation data signal input. Thus, for such a case, markings 210 may be configured with spacing SP1 that is sized wider, e.g., markings 210 are further apart, to provide a lower number of markings 210 and therefore generate a lower frequency rotation data signal 194. In one embodiment, to minimize angular aberrations during the electron beam writing process a center of optical encoder wheel 146 and optical detector 174 may be aligned along a longitudinal processing axis 214 parallel to the direction of movement of substrate 160 relative electron beam 162 (See FIG. 1).

Figure 3:
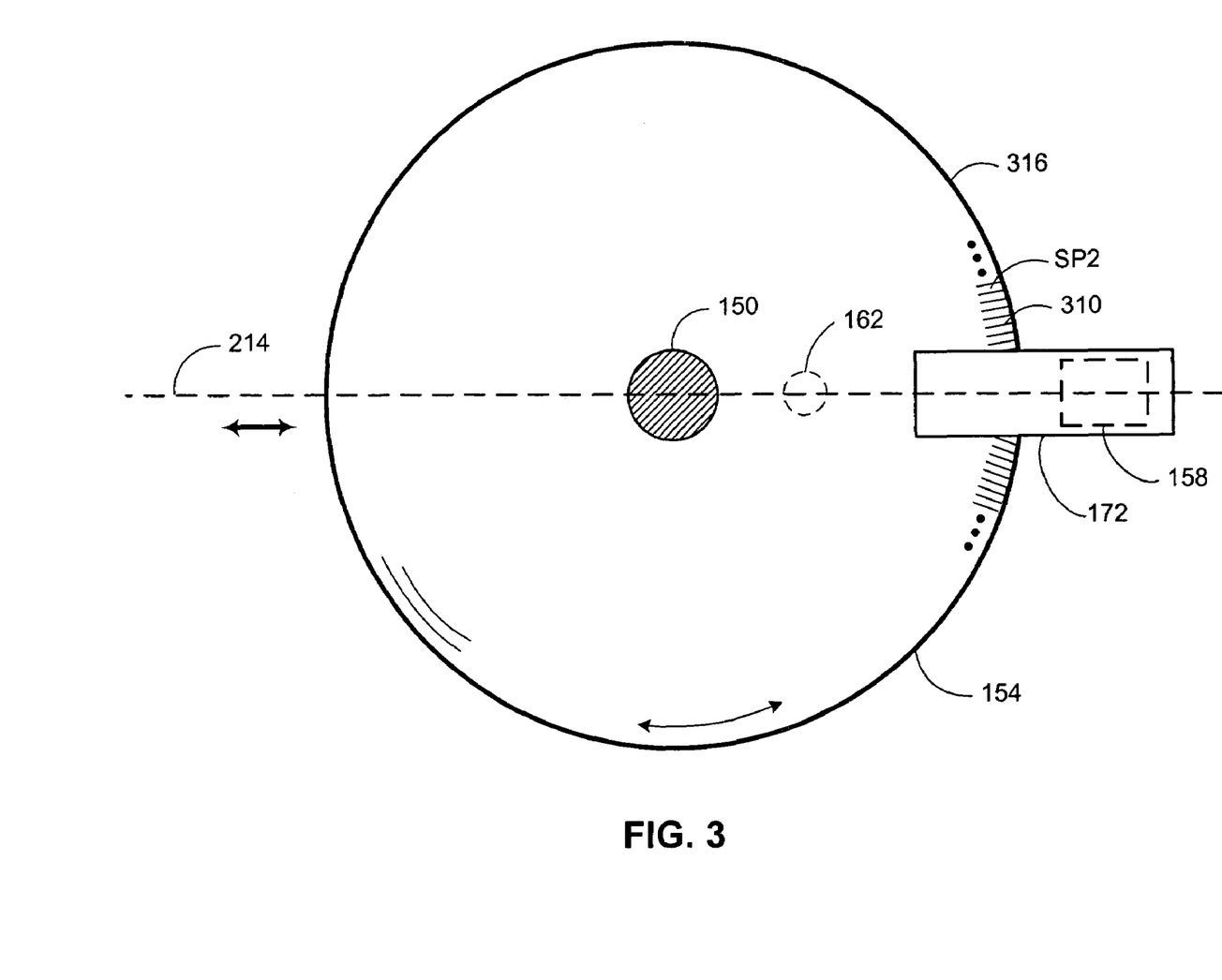
FIG. 3 is a high-level illustration of one embodiment of an encoder wheel of the electron beam substrate processing system of FIG. 1 in accordance with embodiments of the invention.

FIG. 3 is a high-level illustration of one embodiment of an encoder wheel 154 of the electron beam substrate processing system 100 of FIG. 1 in accordance with embodiments of the invention. Encoder wheel 154 includes a plurality of markings 310 disposed on outer perimeter 316, e.g., edge, (only some examples of which are illustrated in FIG. 3). Markings 310 may be spaced apart by a spacing of SP2. For purposes of clarity, markings 310 shall be described in terms of an about equal spacing of SP2, however virtually any spacing configuration may be used to advantage. Spacing SP2 may be configured to accommodate a plurality of position control systems to accurately time, for example when electron beam 162 should be off or on when writing a substrate pattern. For example, positional control systems may work better with a higher frequency pattern clock signal 195. Thus, in such cases markings 310 may have spacing SP2 configured with a narrow spacing, e.g., markings 310 are spaced closer together, to provide a larger number of markings to therefore provide a higher frequency pattern clock signal 195. In one embodiment, to minimize angular aberrations during the electron beam writing process a center of optical encoder wheel 154 and optical detector 172 may be aligned along a longitudinal processing axis 214 parallel to the direction of movement of substrate 160 relative electron beam 162 (See FIG. 1).

In one operational embodiment, spacing SP1 and SP2 are configured to optimize rotation data signal 194 and pattern clock signal 195 at one or more predetermined spindle shaft 150 rotational speeds. For example, spacing SP1 may be set further apart to provide a lower frequency rotation data signal 194 relative pattern clock signal 195 for greater rotation control of spindle shaft 150. Further, spacing SP2 may be configured to provide a higher frequency pattern clock signal 195 relative rotation data signal 194 to provide a greater frequency control signal 198 described further below with respect to FIG. 4. While encoder wheel 146 and encoder wheel 152 are described in terms of generating rotation data signal 194 and pattern clock signal 195, respectively, it is understood that the functions of encoder wheel 146 and encoder wheel 152 can be reversed in a different embodiment.

Figure 4:
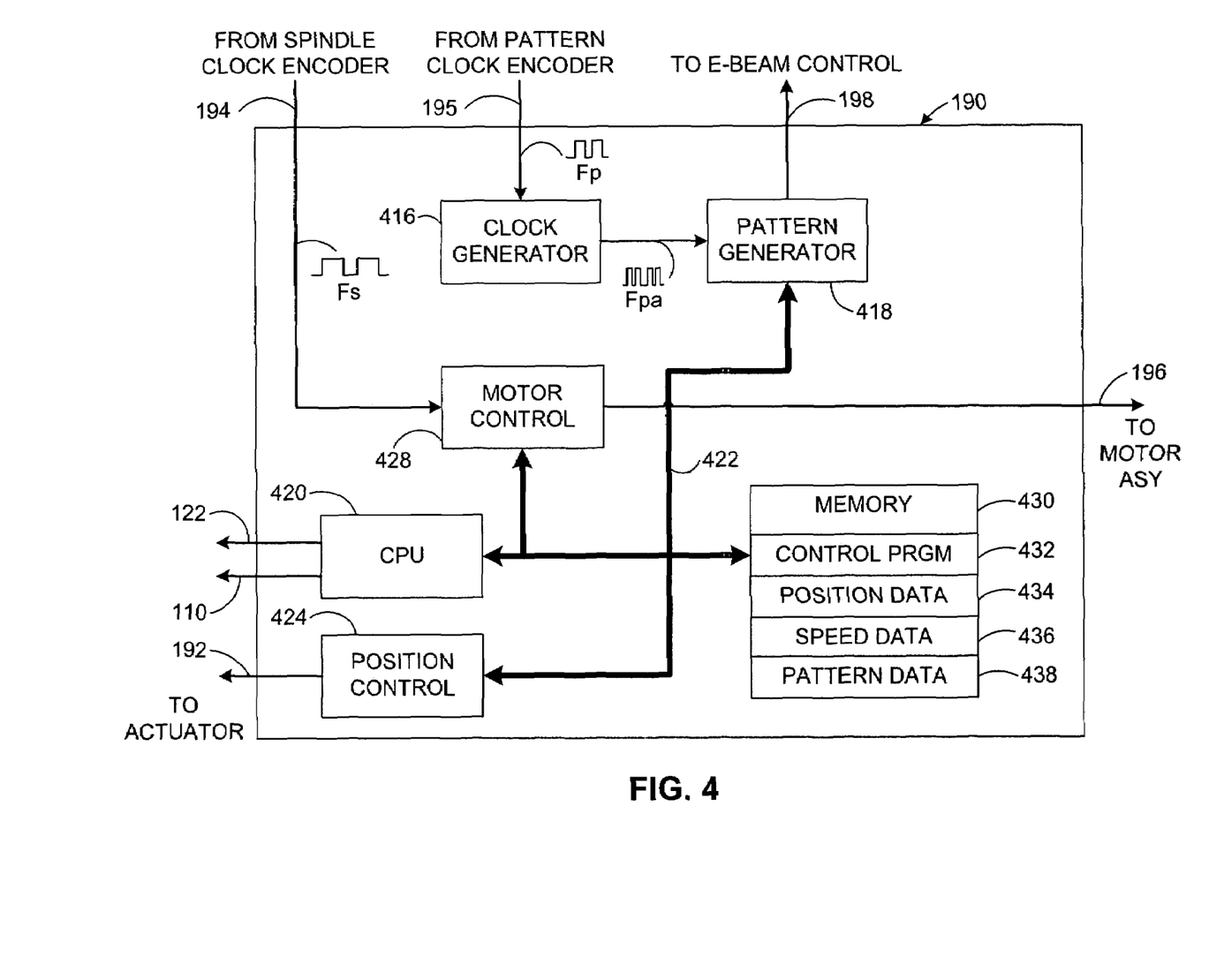
FIG. 4 is a high-level schematic of one embodiment of a substrate process controller of FIG. 1 in accordance with embodiments of the invention.

FIG. 4 is a high-level schematic of one embodiment of a substrate process controller 190 of FIG. 1 in accordance with embodiments of the invention. In one embodiment, substrate process controller 190 includes Central Processing Unit (CPU) 420 and memory 430. The CPU 420 may be under the control of an operating system that may be disposed in memory 430. Virtually any operating system supporting the configuration functions disclosed herein may be used. Memory 430 is preferably a random access memory sufficiently large to hold the necessary programming and data structures of the invention. While memory 430 is shown as a single entity, it should be understood that memory 430 may in fact comprise a plurality of modules, and that memory 430 may exist at multiple levels, from high speed registers and caches to lower speed but larger direct random access memory (DRAM) chips.

Illustratively, memory 430 may include substrate process control program 432 that, when executed on CPU 420, controls at least some operations of electron beam substrate processing system 100. The substrate process control program 432 may use any one of a number of different programming languages. For example, the program code can be written in PLC code (e.g., ladder logic), a higher-level language such as C, C++, Java, or a number of other languages. While substrate process control program 432 may be a standalone program, it is contemplated that substrate process control program 432 may be combined with other programs.

In one embodiment, memory 430 may include speed data 436. Speed data 436 may be used by substrate process controller 190 to control one or more rotational speeds of spindle shaft 150. Speed data 436 may include predetermined rotation data based on previous substrate processes, and may be derived from rotation data signal 194. In another embodiment of the present invention, memory 430 may include position data 434. Position data 434 may be used by substrate process controller 190 to horizontally position spindle motor assembly 134 within vacuum chamber 130. Memory 430 may include pattern data 438. In one embodiment, such pattern data 438 may be derived by CPU 420 from rotation data signal 194, position data 434, and pattern clock signal 195 to determine one or more angular positions of substrate surface targets based on rotational speed of the substrate and radial position of electron beam 162 relative the center axis of substrate 160.

In one embodiment, substrate process controller 190 includes motor control circuit 428, pattern clock generator circuit 416, pattern generator circuit 418, and position control circuit 424. Motor control circuit 428, pattern generator circuit 418, and position control circuit 424 are electrically connected to CPU 420 via bus 422. CPU 420 may be used to control at least portion of Motor control circuit 428, pattern generator circuit 418, and position control circuit 424 described herein. For example, CPU 420 may set a desired rotational speed of spindle shaft 150 using speed data 436. Further, CPU 420 may be used to operate pattern generator circuit 418 such that patterns stored in pattern data 438 are written on a substrate surface. In addition, CPU 420 may be used to position spindle motor assembly to one or more processing positions, e.g., tracks, in proximity of electron beam 162 by controlling actuator 132 via control signal 192 from position control circuit 424. To maintain a vacuum seal between vacuum chamber 130 and control section 178, signal 192 may be coupled to actuator 132 through seal 138 (See FIG. 1).

Motor control circuit 428 may be configured to control the rotational velocity of spindle shaft 150 using a feedback loop process. Motor control circuit 428 provides signal 196 to spindle motor assembly 134 in response to rotation data signal 194 having a frequency Fs. Such a frequency Fs may be configured to increase loop control of a rotational velocity of spindle shaft 150 over a range of rotational speed velocities. Motor control circuit 428 may be configured to adjust rotational speed of spindle shaft 150 to a constant velocity for processing substrates 160 used to produce media for constant velocity modes such as magnetic disk drives, and the like. Motor control circuit 428 may be configured to adjust rotational speed of spindle shaft 150 to a non-constant velocity for processing optical media used in non-constant velocity modes such as CDs, DVDs, and the like. For example, motor control circuit 428 may be configured to process rotation data signal 194 to maintain rotation speed of spindle shaft 150 within a range of spindle shaft rotational speeds such as may be found in speed data 436. In another operational mode, motor control circuit 428 may be controlled by substrate process controller 190 to vary the rotational speed of spindle shaft 150 as a function of substrate radius, e.g., track position. For example, for optical media such as CDs, a given target size (data spot) may be about the same size. Thus, to write more data at an inner radius of the substrate, substrate process controller 190 may be configured to change rotational speed of spindle shaft 150 as needed during processing.

Pattern clock generator circuit 416 is configured to provide a pattern clock signal Fpa to pattern generator circuit in response to pattern clock signal 195. In one embodiment, pattern clock generator circuit 416 is configured as a phase locked loop (PLL) circuit. In such a PLL circuit configuration, pattern clock generator circuit 416 phase locks a higher frequency signal Fpa to a pattern clock signal 195 at a lower frequency Fp. PLL may be derived from virtually any PLL circuit such as an analog PLL, digital PLL, or combinations thereof, that may translate pattern clock signal 195 from a lower clock frequency Fp to a higher clock frequency Fpa. For example, PLL may include a direct digital synthesizer (DDS) clocked by an internal or external oscillator (not shown). Such a DDS may be configured to generate a higher frequency pattern clock signal Fpa in response to pattern clock signal 195 at a lower frequency Fp.

Pattern generator circuit 418 controls at least some of the operations of electron beam assembly 180 to generate an electron-beam processing pattern. For example, pattern generator circuit 418 may process such pattern clock signal Fpa to determine processing times to activate or deactivate a blanking operation of electron beam assembly 180 based on one or more rotational speeds of substrate 160 and a position of the electron beam 162 relative one or more target processing areas of substrate 160. In one embodiment, pattern generator circuit 418 outputs control signal 198 responsive to pattern clock signal Fpa. Such control signal 198 may be used to modulate electron beam 162 on and off to process substrate 160. In one configuration, pattern data 438 is provided to pattern generator circuit 418 via bus 422. Such pattern data 438 may be used with control signal 198 to write one or more patterns on at least some portion of the surface of substrate 160 exposed to electron beam 162.

In one operational embodiment, encoder wheel 146, encoder wheel 154, and substrate 160 are mechanically rotated along with spindle shaft 150. Optical detector 174 provides rotation data signal 194 associated with the rotation of encoder wheel 146 to substrate process controller 190. Optical detector 172 provides pattern clock signal 195 associated with the rotation of encoder wheel 154 to substrate process controller 190. Motor control circuit 428 receives and processes rotation data signal 194 and outputs signal 196 to spindle motor assembly 134 to control one or more rotational speeds of spindle shaft 150. CPU 420 determines processing patterns associated with substrate rotation speeds and positional placement of each substrate target to position electron beam 162 thereon. Such processing patterns may be sent to pattern generator circuit 418 for processing thereof via bus 422. Pattern clock generator circuit 416 generates pattern clock signal Fpa in response to pattern clock signal 195. CPU 420 controls pattern generator circuit 418 to process pattern clock signal Fpa. Pattern generator circuit 418 outputs control signal 198 to electron beam assembly 180 for control of electron beam 162 in response to pattern clock signal Fpa. Therefore, during processing as substrate 160 is rotated, rotation speed of the substrate 160 is controlled using rotation data signal 194 and electron beam 162 is turned on and off in accordance to pattern data 438 clocked by pattern clock signal Fpa.

Figure 5:
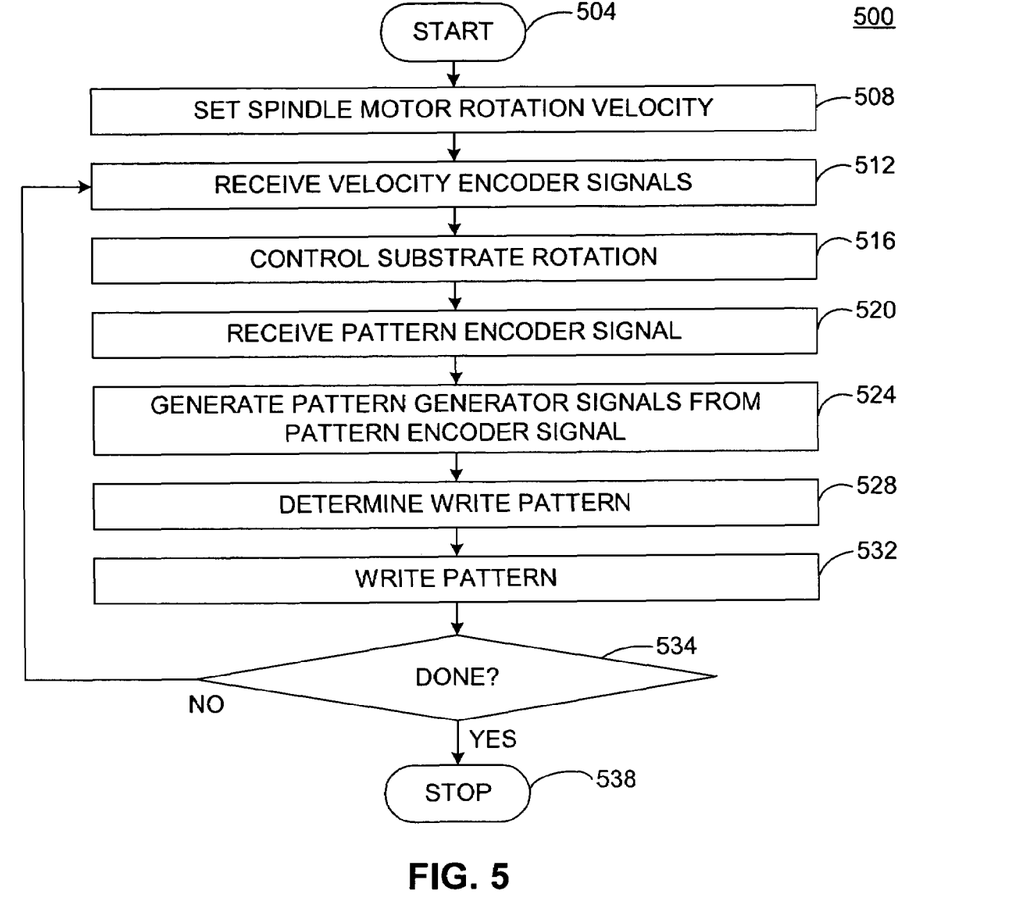
FIG. 5 is a flowchart illustrating a method for processing a substrate with an electron beam processing system of FIG. 1 in accordance with embodiments of the invention.

FIG. 5 is a high-level flow diagram of one embodiment of a method 500 of processing a substrate 160 with an electron beam processing system 100 of FIG. 1 in accordance with embodiments of the invention. Method 500 may be entered into at 504 when, for example, substrate process control program 432 is activated. At 508, spindle motor rotational speed is set, for example, to establish rotation velocity of a substrate 160 to at least one desired rotational velocity. At 512, rotation encoder signals, e.g., rotation data signal 194, are received by data signal processor such as substrate process controller 190 for processing thereof. Spindle motor velocity is controlled at 516 using such rotation encoder signals to maintain at least one desired substrate rotational velocity within a desired rotational velocity range. At 520, pattern clock signals, such as for example pattern clock signals 195, are received for processing. At 524, pattern encoder signals are processed to provide pattern generation signals, e.g., control signal 198. At least one or more electron beam write patterns for substrate surfaces are determined at 528. At 532, such pattern generation signals and write patterns are processed by substrate processing system, such as electron beam substrate processing system 100, to write at least one pattern on one or more substrate surfaces using electron beam processing. At 534, if electron beam substrate processing is finished, then method 500 ends at 538. If however, method 500 is not ended then method 500 returns to 512.

While the foregoing is directed to embodiments of the invention, other and further embodiments of the invention may be devised without departing from the basic scope thereof. The scope of the invention is determined by the claims that follow and equivalents.

The invention claimed is:

1. An electron beam substrate processing apparatus, comprising:
    a substrate processing chamber defined by sidewalls, a bottom, and a top;
    a spindle motor assembly moveably disposed within the substrate processing chamber;
    a spindle shaft extending from the spindle motor assembly toward the top;
    a substrate support member disposed on an end of the spindle shaft distal the spindle motor assembly, the substrate support member having a substrate supporting surface thereon;
    a first encoder wheel disposed on the spindle shaft and positioned adjacent the substrate support member;
    a first optical detector positioned in optical communication with the first encoder wheel, the first optical detector being configured to output rotation data signals in response to detected rotation of the first encoder wheel;
    a second encoder wheel disposed on the spindle shaft and positioned adjacent the substrate support member;
    a second optical detector positioned in optical communication with the second encoder wheel, the second optical detector being configured to output pattern data signals in response to detected rotation of the second encoder wheel, said pattern data signals outputted by said second optical detector different than said rotation data signals outputted by said first optical detector; and
    an electron beam assembly disposed on the substrate processing chamber and configured to direct an electron beam onto a surface of the substrate for processing.

2. The apparatus of claim 1, further comprising an actuator coupled to the spindle motor assembly and configured to move the spindle motor assembly in a horizontal motion relative a longitudinal axis of the spindle shaft.

3. The apparatus of claim 1, further comprising a vacuum pump coupled to the substrate processing chamber to provide a vacuum therein.

4. The apparatus of claim 1, further comprising a controller configured to control at least one operation of the apparatus.

5. The apparatus of claim 4, wherein the controller comprises a motor speed control circuit configured to process at least some of the rotation data signals to control the rotational motion of the spindle shaft.

6. The apparatus of claim 4, wherein the controller comprises a data signal processing circuit configured to process at least some of the pattern data signals and output pattern data signals in response thereto to the electron beam assembly for control thereof.

7. A method of processing substrates with an electron beam processing system, comprising:
    rotating a substrate support member configured to hold the substrate thereon, for processing;
    generating rotation data signals from first encoder assembly associated with a rotational movement of the substrate support member;
    generating pattern clock signals from second encoder assembly associated with the rotational movement of the substrate support member; and
    processing at least some of the pattern clock signals to generate an electron beam processing pattern for writing a pattern on a surface of the substrate.

8. The method of claim 7, wherein the generating rotation data signals comprises optically detecting the rotational movements of one encoder wheel in axial alignment with and adjacent the rotating substrate support member.

9. The method of claim 7, wherein the generating pattern clock signals comprises optically detecting the rotational movements of another encoder wheel in axial alignment with and adjacent the rotating substrate support member.

10. The method of claim 7, further comprises processing at least some of the rotation data signals with a motor control circuit configured to maintain one or more desired rotational speeds of the substrate support member.

11. The method of claim 7, wherein a frequency of the pattern clock signals is greater than a frequency of the rotation data signals.

12. The method of claim 7, wherein the processing at least some of the data signals to determine an electron beam processing pattern comprises processing at least some of the pattern clock signals to generate pattern data signals.

13. The method of claim 12, wherein the processing at least some of the pattern clock signals to generate the pattern data signal comprises processing at least some of the pattern data signals to generate an electron beam control signal.

14. An apparatus for processing a substrate with electron beams, comprising:
    rotation means for rotating a substrate support member for processing a substrate thereon;
    first signal generator means for generating a rotation clock signal from the axial rotation of the substrate;
    second signal generator means for generating a pattern clock signal from the axial rotation of the substrate; and
    electron beam generation means for processing the substrate with electron beams.

15. The apparatus of claim 14, further comprising processor means for processing the pattern clock to generate a substrate process pattern therefrom.

16. The apparatus of claim 14, wherein the rotation means comprises a movable spindle motor assembly having a spindle shaft extending therefrom coupled on one end to the substrate support member.

17. The apparatus of claim 16, wherein the first signal generator means comprises at least one encoder wheel positioned on the spindle shaft parallel to and adjacent a substrate support member configured to support the substrate thereon for processing.

18. The apparatus of claim 16, wherein the first signal generator means comprises a means for detecting timing marks on the at least one encoder wheel to generate the rotation clock signals.

19. The apparatus of claim 16, wherein the second signal generator means comprises at least one encoder wheel positioned on the spindle shaft parallel to and adjacent a substrate support member configured to support the substrate thereon for processing.

20. The apparatus of claim 19, wherein the second signal generator means comprises a means for detecting timing marks on the at least one encoder wheel to generate the pattern clock signals.

* * * * *